US 6,704,179 B2

(12) United States Patent
Voldman

(10) Patent No.: US 6,704,179 B2
(45) Date of Patent: Mar. 9, 2004

(54) AUTOMATED HIERARCHICAL PARAMETERIZED ESD NETWORK DESIGN AND CHECKING SYSTEM

(75) Inventor: Steven H. Voldman, South Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 92 days.

(21) Appl. No.: 09/683,970

(22) Filed: Mar. 7, 2002

(65) Prior Publication Data

US 2003/0147187 A1 Aug. 7, 2003

Related U.S. Application Data

(60) Provisional application No. 60/352,864, filed on Feb. 1, 2002.

(51) Int. Cl.[7] ................................................. H02H 9/00
(52) U.S. Cl. ............................ 361/56; 361/58; 361/111
(58) Field of Search .......................... 361/56, 58, 91.1, 361/111, 118, 127

(56) References Cited

U.S. PATENT DOCUMENTS

| 5,182,220 A | 1/1993 | Ker et al. ....................... 437/34 |
| 5,410,254 A | 4/1995 | Consiglio ..................... 324/456 |
| 5,616,943 A | 4/1997 | Nguyen et al. ............. 257/355 |
| 5,675,260 A | 10/1997 | Consiglio ..................... 324/763 |
| 5,708,549 A | 1/1998 | Croft ............................ 361/56 |
| 6,035,106 A | * 3/2000 | Carruthers et al. ............. 703/1 |
| 6,087,841 A | 7/2000 | Bonaccio et al. ........... 324/757 |
| 6,160,457 A | 12/2000 | Wu ....................... 331/116 FE |

OTHER PUBLICATIONS

Francisco H. de la Moneda, et al., "Hybrid Protective Device for MOS–LSI Chips", IEEE Transactions on Parts, Hybrids, and Packaging, vol. PHP–12, No. 3, Sep. 1976.

* cited by examiner

Primary Examiner—Stephen W. Jackson
(74) Attorney, Agent, or Firm—McGuireWoods LLP; Richark Kotulak

(57) ABSTRACT

A computerized method for designing electrostatic discharge (ESD) protection circuits uses a hierarchical system of parametrized cells (p-cells) which are constructed into higher level ESD networks. Lowest order p-cells pass user defined parameters to higher order p-cells to form an ESD protection circuit meeting the design criteria. Ones of the p-cells are "growable" such that they can form repetition groups of the underlying p-cell element to accommodate the design parameters. This allows for change of circuit topology as well as structure size in an automated fashion. Layout and circuit schematics are auto-generated with the user varying the number of elements in the circuit by adjusting the input parameters. The circuit topology automation allows for the customer to autogenerate new ESD circuits and ESD power clamps without additional design work. Interconnects and wiring between the circuit elements are also autogenerated.

19 Claims, 7 Drawing Sheets

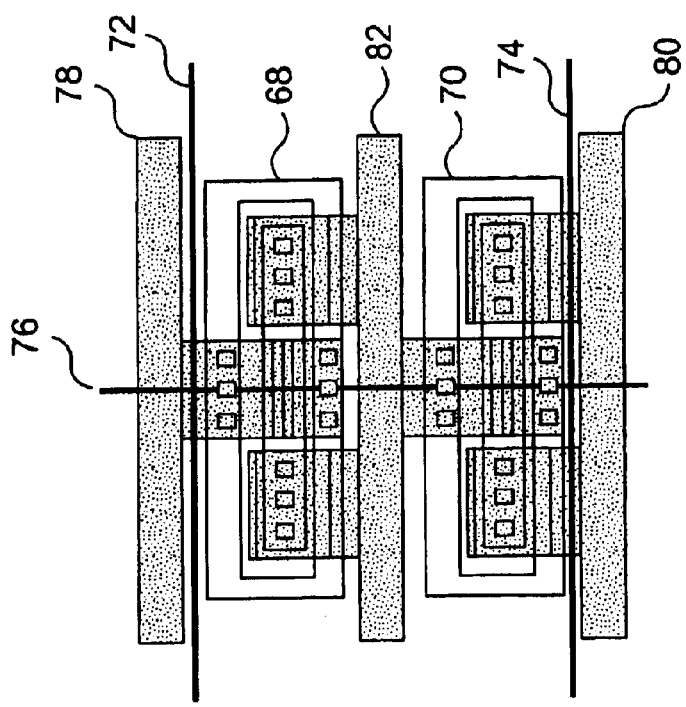
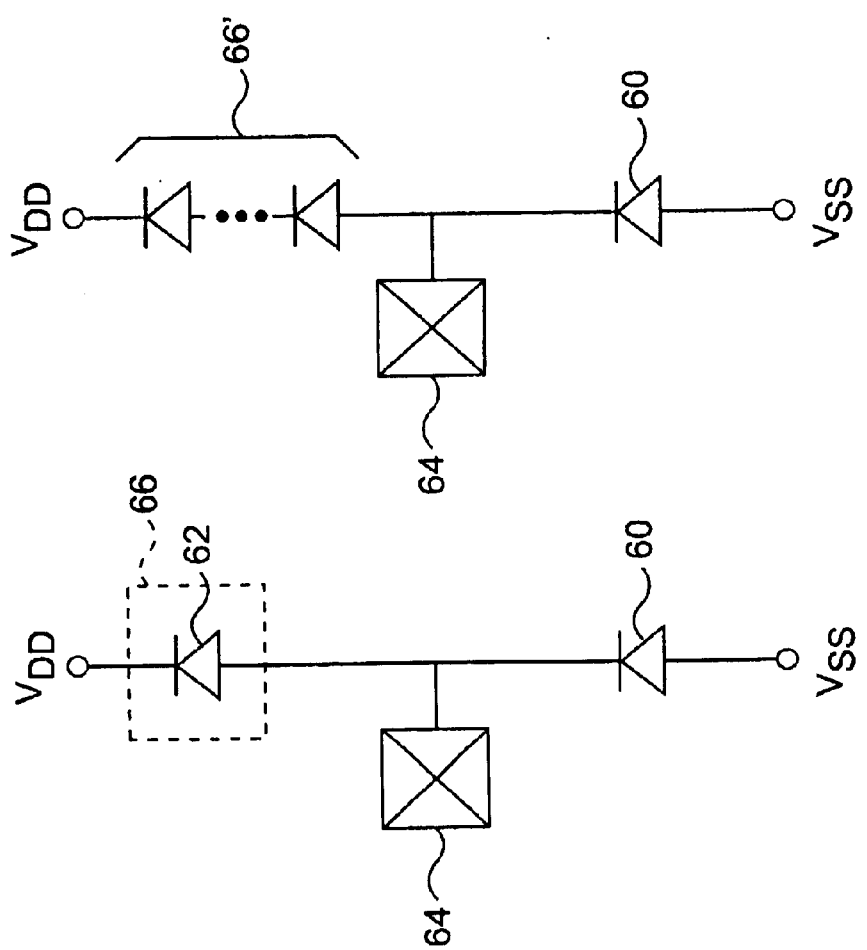
FIG. 3C
FIG. 3B
FIG. 3A

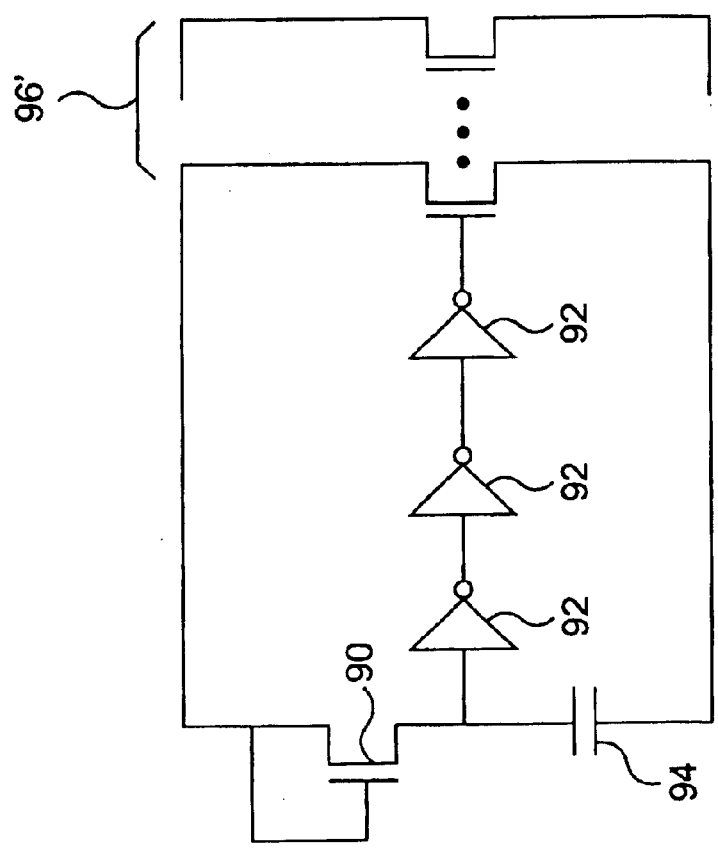
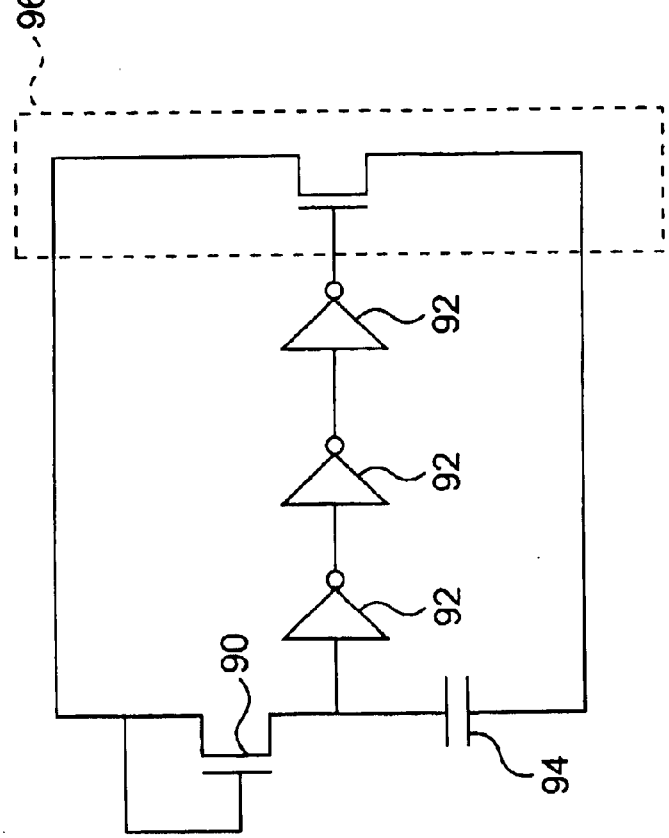
FIG. 5A
FIG. 5B

AUTOMATED HIERARCHICAL PARAMETERIZED ESD NETWORK DESIGN AND CHECKING SYSTEM

CROSS REFERENCE TO RELATED APPLICATIONS

This application is related and claims priority to U.S. Provisional Application Ser. No. 60/352,864, filed on Feb. 1, 2002.

BACKGROUND OF THE INVENTION

1. Field of the Invention

The present invention generally relates to electrostatic discharge (ESD) protection circuits and, more particularly, to an automated computer aided design (CAD) system for automatically designing ESD circuits for a given application.

2. Description of the Related Art

As electronic components are getting smaller and smaller along with the internal structures in integrated circuits, it is getting easier to either completely destroy or otherwise impair electronic components. In particular, many integrated circuits are highly susceptible to damage from the discharge of static electricity, even at levels which can neither be seen nor felt. Electrostatic discharge (ESD) is the transfer of an electrostatic charge between bodies at different electrostatic potentials (voltages), caused by direct contact or induced by an electrostatic field. The discharge of static electricity, or ESD, has become a critical problem for the electronics industry. Device failures are not always immediately catastrophic. Often the device is only slightly weakened but is less able to withstand normal operating stresses and, hence, may result in a reliability problem. Therefore, various ESD protection circuits must be included in the device to protect the various components. Various considerations are necessary for ESD protection circuits. For example, ESD protection circuits for input nodes must also support quality dc, ac, and RF model capability in order to co-design ESD circuits for analog and RF circuits. With the growth of the high-speed data rate transmission, optical interconnect, wireless and wired marketplaces, the breadth of applications and requirements is broad. Each type of application space has a wide range of power supply conditions, number of independent power domains, and circuit performance objectives. As a result, an ESD design system which has dc and RF characterized models, design flexibility, automation, ESD characterization, and satisfies digital, analog and RF circuits is required to design and co-synthesize ESD needs of mixed signal RF technology.

Much effort has been expended by industry to protect electronic devices from ESD damage. Traditionally, ESD designs are custom designed using graphical systems. ESD ground rules and structures are typically built into the designs requiring a custom layout. This has lead to custom design for digital products such as DRAMs, SRAMs, microprocessors, ASIC development and foundry technologies. This design practice does not allow for the flexibility needed for RF applications. A difficulty in the design of RF ESD solutions is that traditionally, specific designs are fixed in size in order to achieve verifiable ESD results for a technology. The difficulty with analog and RF technology is that a wide range of circuit applications exists where one ESD size structure is not suitable due to loading of the circuit. A second issue is that the co-synthesis of the circuit and the circuit must be done to properly evaluate the RF performance objectives. RF characterization of the network that is flexible with the device size is important for the evaluation of the tradeoffs of RF performance and ESD. A third issue for RF mixed signal designs, there are analog and digital circuits. In these environments, there are some products which primarily use digital CMOS circuits and some which are bipolar dominated. In this environment, some applications prefer CMOS-based ESD networks, and others are motivated to use Bipolar-based ESD networks.

SUMMARY OF THE INVENTION

It is therefore an object of the present invention to provide an automated ESD design system which eliminates the need to custom build ESD circuits for each new application.

The present invention provides an ESD CAD strategy that provides design flexibility, RF characterization and models of ESD elements, automation, and choice of ESD network type. The present invention uses a hierarchical system of parametrized cells, herein after referred to a "p-cells", which are constructed into higher level ESD networks. Lowest order p-cells are RF and dc characterized. ESD verification, dc characterization, schematics and LVS are completed on the higher order circuits. RF characterization can be done on the lowest level pcell circuits or higher level pcell circuits.

Diode, bipolar and MOSFET hierarchical cells were used to establish both CMOS MOSFET-based ESD networks and SiGe bipolar-based networks. The parametrized cells, or "p-cells", can be constructed in a commercially available CAD software environment such a CADENCE, (Registered Trademark) design system to form a kit. Ones of the p-cells are "growable" elements such that they can form repetition groups of the underlying p-cell element to accommodate the design parameters. The p-cells fix some variables, and pass some variables to the higher order p-cell circuits through inheritance. From base p-cells, ESD circuits are constructed for input pads, VDD-to-VSS power clamps, VSS-to-VSS power clamps, and VCC-to-VDD power clamps. In these categories, there exists both the CMOS-based and the BiCMOS SiGe-based implementations.

The ESD design system allows for change of circuit topology as well as structure size in an automated fashion. Layout and circuit schematics are auto-generated with the user varying the number of elements in the circuit. The circuit topology automation allows for the customer to autogenerate new ESD circuits and ESD power clamps without additional design work. Interconnects and wiring between the circuit elements are also autogenerated. This automation allows for size (spatial) variables, product application variables and ESD protection levels data to achieve either area requirements, product specifications or ESD objectives.

BRIEF DESCRIPTION OF THE DRAWINGS

The foregoing and other objects, aspects and advantages will be better understood from the following detailed description of a preferred embodiment of the invention with reference to the drawings, in which:

FIG. 3A is a circuit diagram showing a hierarchical p-cell double diode ESD protection device for an input pad;

FIG. 3B, is the double diode design of FIG. 3A highlighting the growable segmentation;

FIG. 3C is a p-cell hierarchical RF double diode circuit highlighting the stretch lines and growable segmentation;

FIG. 5A is a hierarchical p-cell design of a Darlington based SiGe BiCMOS power clamp;

FIG. 5B, is a hierarchical p-cell design of the Darlington based SiGe BiCMOS power clamp of FIG. 4A highlighting the growable segmentation;

DETAILED DESCRIPTION OF A PREFERRED EMBODIMENT OF THE INVENTION

Figure 1:
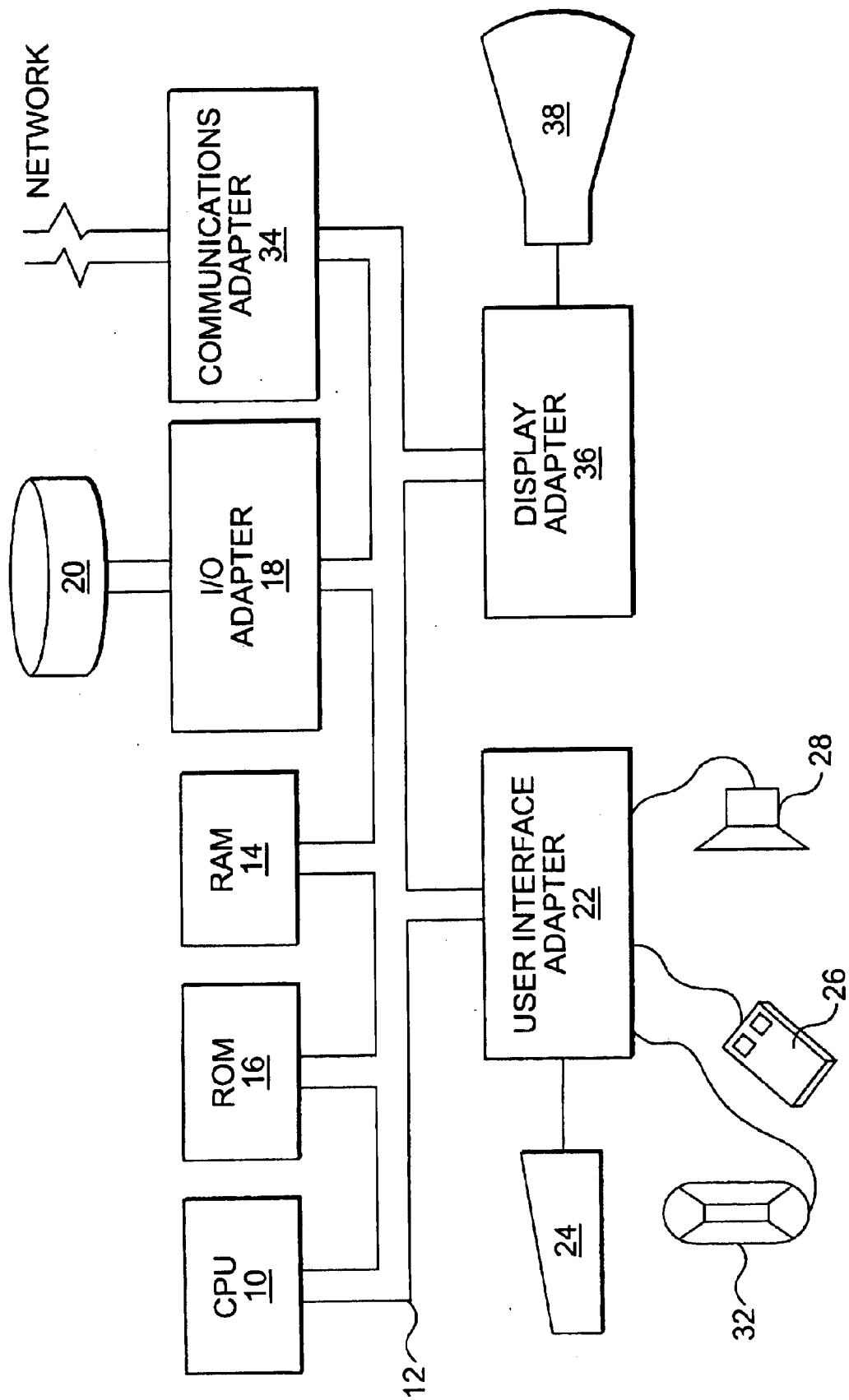
FIG. 1 is a block diagram illustrating the computer environment within which the present invention may be practiced.

Referring now to the drawings, and more particularly to FIG. 1, there is shown a representative hardware environment on which the subject invention may be implemented. This hardware environment may be a personal computer or a workstation as is known in the art. The hardware includes a central processing unit (CPU) 10 attached to a system bus 12 to which are attached a random access memory (RAM) 14, a read only memory (ROM) 16, an input/output (I/O) adapter 18, and a user interface adapter 22. The RAM 14 provides temporary storage for application program code and data, while ROM 16 typically includes the basic input/output system (BIOS) code. The I/O adapter 18 is connected to one or more Direct Access Storage Devices (DASDs), here represented as a disk drive 20. The user interface adapter 22 has attached to it a keyboard 24, a mouse 26, a speaker 28, a microphone 32, and/or other user interface devices. A communications adapter 34 is connected to the bus 12 and may also be provided to connect to a local area network (LAN).

Figure 2:
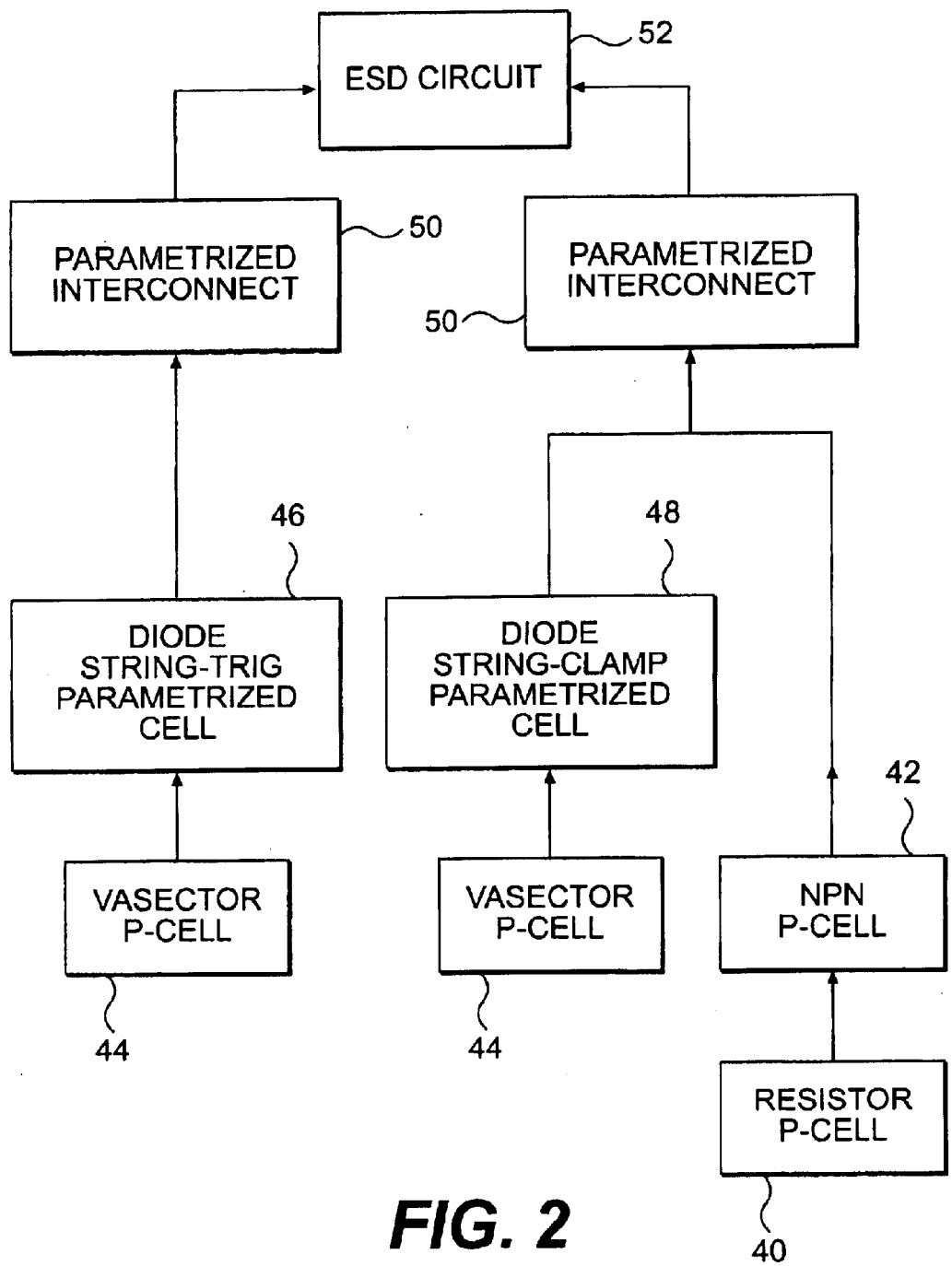
FIG. 2 is a diagram showing the hierarchical p-cell building blocks for designing an ESD circuit.

As are all circuits, high level ESD circuits are comprises of a plurality of lower level sub-circuits which in turn can be expressed in terms of still lower level elements. As shown in FIG. 2, by way of example, the lowest level ESD elements may be expressed as simple parameterized cells ("p-cells") such are resistor p-cells 40, transistor p-cells 42, varactors p-cells 44, as well as any other basic electronic component. These in turn, can be used to express higher level parameterized circuits such as diode string trigger p-cells 46, and diode string clamp p-cells 48. These parameterized circuits can in turn be connected with parameterized interconnects 50 to ultimately form the ESD circuit 52.

The p-cells exist is a computer aided design (CAD) environment, and are essentially a computer model of the particular element comprising all of the parameters necessary for the computer to simulate that element. The parameters that define the device itself are fixed while others of the parameters may be defined by the user depending on the needs of the circuit to be designed. For example, the user may be able to enter various parameters such as input voltage, power supply voltage, temperature tolerances, frequency ranges, etc. Parameters may also be auto-generated based on other user input considerations such as power supply ranges, current stress, and desired ESD protection. Higher level p-cells inherit the user defined parameters and autogenerated parameters from the lower level p-cells.

The present invention may be embodied as a design "kit" running in the CAD environment where the kit allows a circuit designer to automatically design an ESD protection circuit for a chip in an expedient manner. The kit comprises design classes for ESD networks. Classifications can include Mixed Signal ESD circuits, Mixed Voltage ESD circuits, and BiCMOS ESD circuits. By way of example, the ESD design kit hierarchy for classes of ESD networks may be as follows:

Category-input pad
Sub-category-Input_RF
-Input_Analog
-Input_Digital
Category-Power Rails
Sub-category-Diode String
-Antiparallel Diode Strings
-Asymmetric Antiparallel Strings
Category-ESD Power Clamps
Sub-category-RC Trigger Clamps
-Bipolar SiGe NPN Darlington Clamps Each category comprises a class of circuits for a particular application such as input pads, power rails and power clamps, as shown above, and each sub-category comprises members of the class.

When designing a circuit, the user will select via a user interface device 22 a category and subcategory for an ESD circuit they wish to design. The computer will prompt the user to enter various parameters or conditions and thereafter the computer will automatically design the required circuit using the basic p-cells as building blocks to form the high level ESD circuit meeting the specified parameters. The higher order elements also being p-cells. Again, just as in the case of the lower level p-cells, various parameters that define the high level ESD circuit itself are fixed while others of the parameters are "growable" depending on the parameters and conditions specified by the user.

For example, for an ESD input pad this design hierarchy has three types of cells, one for RF, one for Analog and one for Digital. ESD input circuits consist of different input circuits for digital, analog and RF circuits. Since different circuits may be required for the different applications, the input circuits are segregated to allow for distinctions of these different signal types. These circuits can include CMOS elements, Bipolar elements or BiCMOS elements. Note that the design system can include standard pcell elements or "ESD robust customized elements". By ESD robust customized elements, the pcell elements can be designed and optimized to avoid any electrostatic discharge sensitivities. These custom pcells can consist of custom MOSFET whose design shapes allow for current uniformity and custom diode structures. These ESD robust pcells for MOSFET can be resistor ballasted MOSFETS, gate-coupled MOSFETs, RC trigged MOSFETs, or salicide-blocked MOSFET elements. For diode elements, these ESD robust element can be optimized to allow for chamfered corners, salicide optimization and metal pattern design. Accordingly, similar concepts can be applied to the ESD robust bipolar elements. For example, an ESD robust custom bipolar pcell may comprise optimized salicide, different ordering of the emitter base and collector and spatial design considerations.

FIG. 3A shows an ESD double diode network comprising diodes 60 and 62 for protecting an input pad 64 for a CMOS digital circuit. For this application, a double diode design p-cell 66 is created. The double diode design is a p-cell 66 allows for the inheritance of four parameters comprising the number and the width of the diode fingers for the "up" and the "down" diode element. The double-diode design is a second order hierarchical implementation that consists of two p+/nwell p-cells or a p+/n-well p-cell with a n-well-to-substrate-diode p-cell implementation. The p+/n-well design has ends that are fixed in design style and whose metal, contacts, and isolation is grow-able in length. Metal bussing is automatically grow-able with the width of the diode structures using algorithms associated with number of fingers and design pitch.

When a circuit designer wishes to create a double diode ESD circuit, he selects this circuit and is prompted to enter a list of design parameters from which the computer will grow the p-cell 66. The parameters, for example, may include:

Peak Input Pad Voltage: ?V
Power Supply 1: ?V
Power Supply 2: ?V
Temperature: ?C.
EVS: ?V
DVS: ?V
Desired ESD Protection Level: ? kV
ESD Type: HBM (Default)
Circuit Application: ? GHz ESD design size of the pcell can be addressed by the desired protection level, ESD model (e.g. HBM, MM, or CDM) or application frequency.

As shown in FIG. 3B, the diode comprising p-cell 66 is grown to contain the appropriate number of diodes based on the input parameters. The design has a higher level p-cell 66' which is generated out of two lower level diode p-cells 66. In the upper level hierarchal cell, inherited parameters of diode collector stripes are autogenerated in an interface panel. For higher level function, based on frequency of the application, the number of cathodes can be scaled inversely with the user application frequency. From this the ESD result can be also displayed when the parameter panel is shown.

FIG. 3C shows an example of the design containing two growable p+/nwell p-cells, 68 and 70 and three stretch lines 72, 74, and 76. The top stretch line 72 has an algorithm associated with the pitch and finger number to move the VDD wire 78 vertically. The lower stretch line 74 is governed by an algorithm moves the VSS bus 80 downward as fingers are added to the lower p-cell element. The vertical stretch line 76 allows the input 82, VDD 78, and VSS 80 metal grow with the length of the diode elements, 68 and 70. For CMOS applications, MOSFETs pcells and ESD customized MOSFET pcells can also be used for ESD protection of input nodes. A number of different circuit topolgies using MOSFET pcells can be integrated into the design system.

For a RF SiGe-based implementation, two varactors can be used instead of diodes 68 and 70. The SiGe-based double diode circuit utilizes the p-cell of the base-collector junction of the varactor p-cell. This p-cell circuit is a hierarchical p-cell which contains the two varactor p-cells, power rails, and growable interconnects. SiGe varactors have been shown to produce excellent ESD performance because of the low resistance subcollector.

Figure 4:
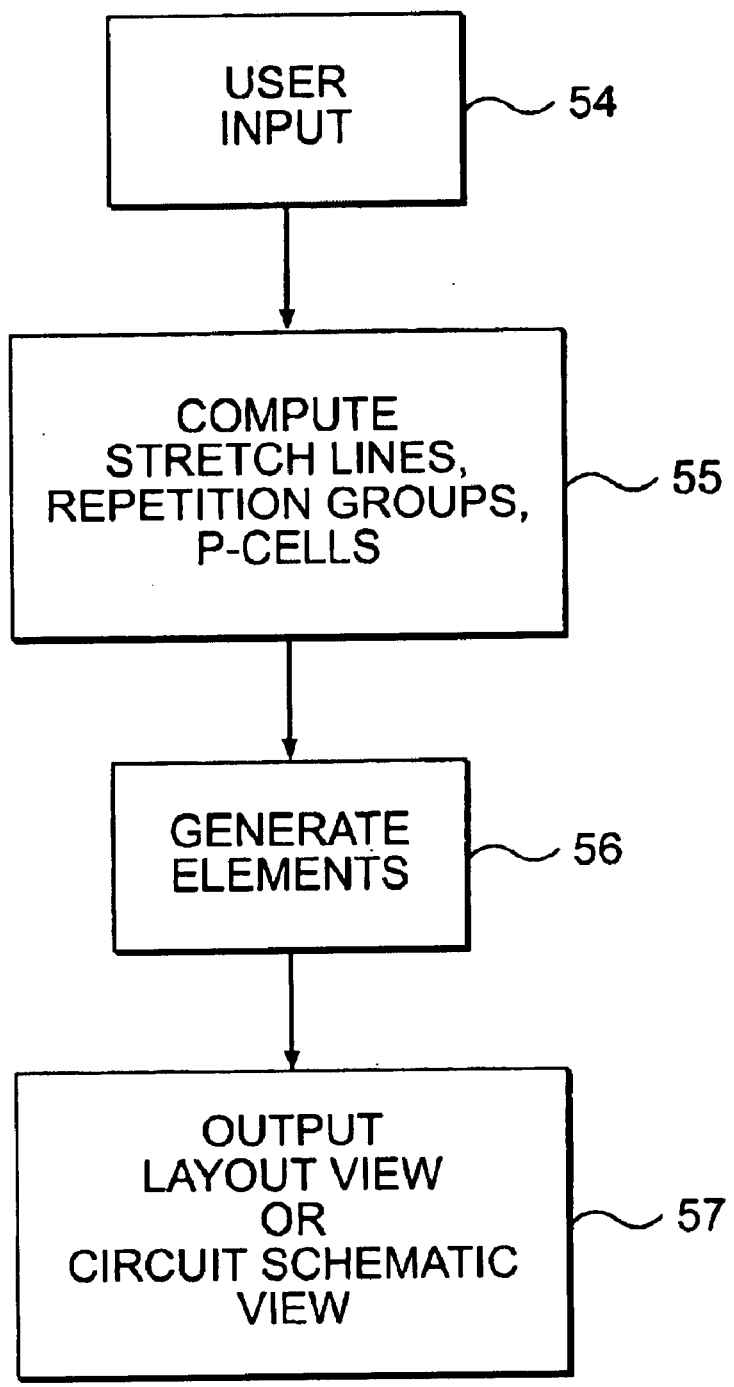
FIG. 4 is a flow diagram showing steps to design an ESD circuit according to the invention.

As illustrated in FIG. 4, the user inputs a list of design parameters 54. Typically the user would be prompted for these parameters based on the type of ESD circuit to be designed. The computer will take these parameters and compute the stretch line p-cells, repetition group p-cells etc. that makes the selected ESD circuit conform to the desired parameters 55. Next, the particular elements comprising the ESD circuit are generated 56 and the computer outputs the result 57 in one of a variety of formats. For example, FIG. 3A shows a circuit schematic view and FIG. 3C shows a layout view.

For rail-to-rail ground ESD circuits, in mixed signal RF applications, functional circuit blocks are separated to minimize noise concerns. Digital noise impacts both the analog and dc circuitry impacting the Noise Figure (NF). Designers will need the ability to estimate the noise and stability of the circuit in the presence of multiple circuits and ESD networks. To eliminate noise, digital circuit blocks are separated from the analog and RF blocks with no common ground bus. The introduction of the ESD elements between the grounds can address the ESD concerns but increases the noise and stability implications. As a result, the co-synthesis of the ESD and noise concerns needs to be flexible to address both issues.

As part of the ESD CAD design system, a hierarchical parameterized cell is designed which forms a bi-directional SiGe varactor strings which can vary the number of varactors and the physical width of each varactor. For example, a design may use 4 varactors in one direction and 2 in the other direction. The automated ESD design system of the present invention has the ability to adjust the design size and the number of elements. In digital circuits, the issue is digital dc voltage separation between the grounds. But in RF circuits, the issue is the capacitive coupling at high frequency. As more elements are added, coupling is eliminated. In the design system, the interconnects and wires automatically stretch and scale with the structure size. Algorithms are developed which autogenerate the interconnects based on the number of diodes "up" versus diodes "down". As elements are added both the layout and physical schematics introduce the elements maintaining the electrical interconnects and pin connection. ESD testing and failure analysis of these elements were characterized for TLP (transmission line pulse), HBM (human body model) and MM (machine model) testing.

A difficulty of BiCMOS technology is that there are many power rail voltage conditions. Applications range from Power amplifiers, VCOs, mixers, hard disk drive circuits, and test equipment. Some chips have negative voltage on the ground connections. As a result, an ESD power clamp strategy must be suitable for CMOS digital blocks, analog blocks and RF circuits.

Referring to FIGS. 5A–6B, the present invention accommodates both SiGe Bipolar-based ESD power clamps, and CMOS-based ESD power clamps. These ESD power clamps are designed out of parameterized cells, are growable, with flexible voltage and trigger conditions.

Referring to FIGS. 5A–5B, for satisfying the CMOS digital circuitry, an RC triggered MOSFET based power clamp is constructed out of parametrized cells which includes an NFET p-cell 90, inverter p-cells 92, and a metal-insulator-metal (MIM) capacitor p-cell 94.

This automated hierarchical RC triggered clamp further comprises a PFET p-cell 96. Just as in the case discussed above, based on parameters input by the designer, the design system of the present invention the p-cell 96 is growable whereby the system will automatically determine how many transistors are required to form the clamp 96'. For different size digital blocks and design form factors, the size of the ESD power clamp can be physically varied. The design is constructed so that the RC discriminator, comprising p-cell 90 and 94, and inverter drive network p-cell 92 is fixed but the output clamp element 96 is a sub-p-cell of the circuit. The output clamp segment is automated to change in physical size 96'.

For the BiCMOS analog and RF functional blocks, automated hierarchical ESD power clamps are designed to allow for different voltage trigger conditions and the size of the power clamp. A first ESD power clamp circuit has a fixed trigger voltage based on the BVCEO of the trigger transistor and the output device is a low fT device with a high BVCEO SiGe NPN device.

Figure 6B:
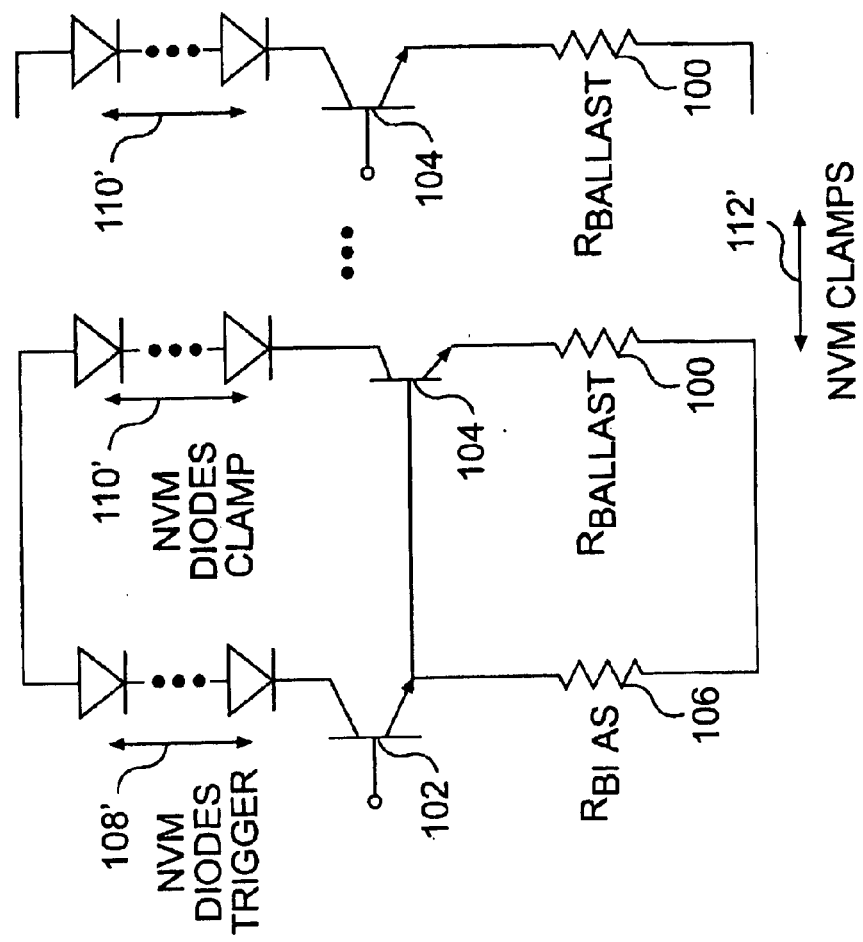
FIG. 6B is a circuit diagram of the hierarchical p-cell design of RC triggered circuit as shown in FIG. 5A highlighting the growable segmentation.
Figure 6A:
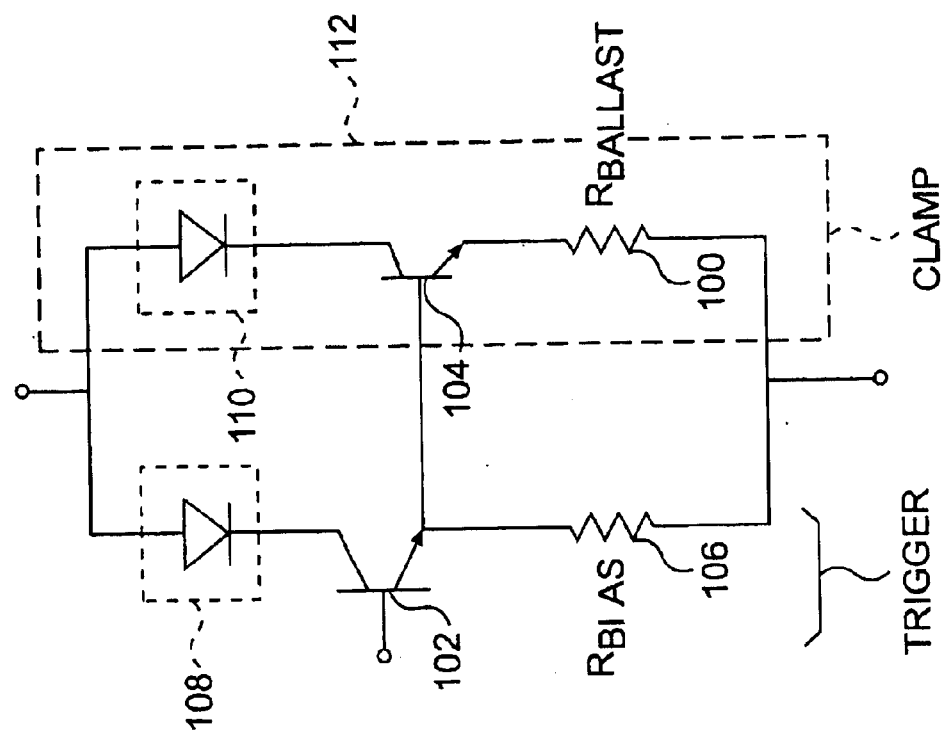
FIG. 6A is a circuit diagram of a hierarchical p-cell design of RC triggered circuit.

As shown in FIG. 6A, in this hierarchical Darlington-type pcell, the design comprises a resistor ballast pcell 100, two transistor pcells 102 and 104, and a bias resistor p-cell 106. In this design, the trigger transistor 102 and the bias resistor 106 are fixed. However, the trigger diode p-cell 108, the clamp diode p-cell 110, and the higher level clamp p-cell 112 can grow depending on the design parameters input. As shown in FIG. 6B, the number of diodes in the trigger p-cell 108', the number of diodes in the clamp p-cell 110' and the number of clamps in the clamp p-cell 112' are growable according to the input design parameters.

Figure 7A:
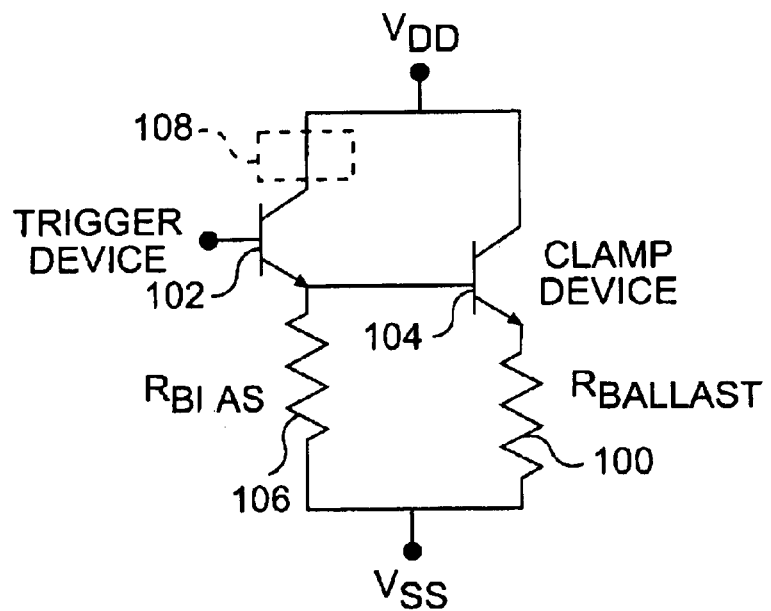
FIGS. 7A–B is a circuit diagram of the hierarchical p-cell design of RC triggered circuit as shown in FIG. 6B showing an example of how the trigger varactor p-cells are calculated.
Figure 7B:
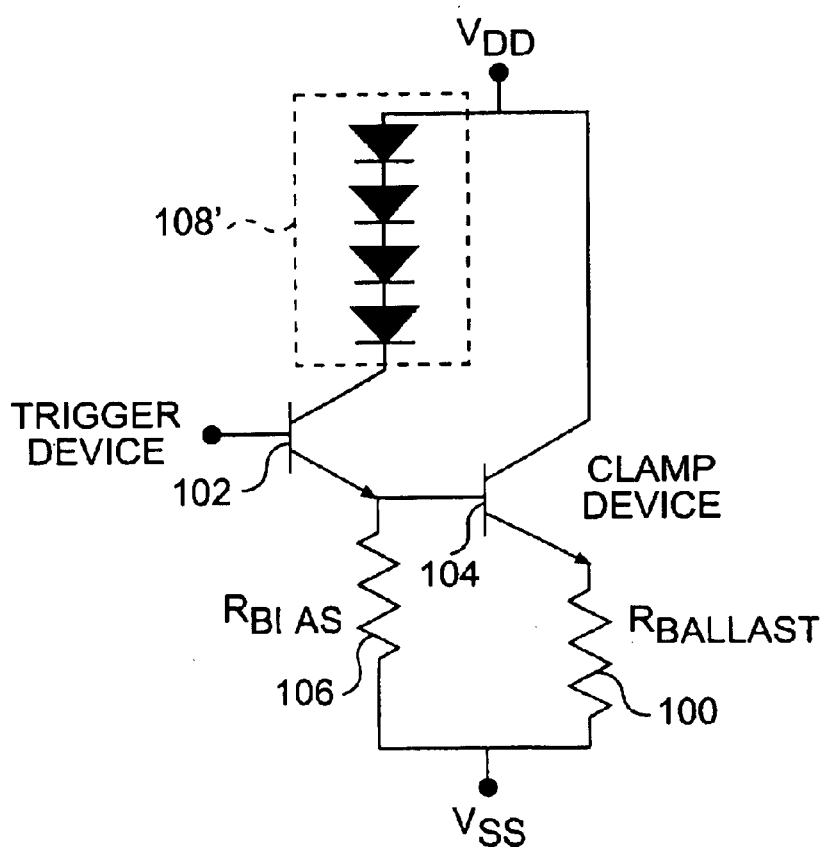

FIGS. 7A–B show a design example for the hierarchical Darlington-type ESD circuit design illustrated in FIGS. 6A–B above. Like items have been labeled with like reference numerals to avoid repetition. The circuit shown in FIG. 7A has a trigger condition that is constrained to the unity current gain cutoff frequency and not suitable for I/O, mixed power supply applications or non-native implementations owing to the fact that the diode (or varistor) p-cell 108 contains zero elements. Different breakdown voltage devices can be used where a switch is provided in the design system to allow for usage of the high breakdown, medium breakdown or low breakdown SiGe npn "This automation allows for utilization of 3 different pcells with a switch that allows for different turn on conditions of the circuit for different power supply voltage conditions.

FIG. 7B shows a new variable trigger implementation where additional elements 108' are placed in series with the trigger element. Placing SiGe varactors in series with the 120 GHz/100 GHz fT/fMAX SiGe HBT device, the trigger condition can be level-shifted to a higher breakdown condition. Adding a string of SiGeC varactors creates a new trigger condition which is defined by the following algoithm:

$$VT = Emus/2P\ fT + N\ Vf - (kT/q)(N-1)N/2\ln(b+1)$$

where N is the number of pnp elements, Vf is the forward diode voltage, and b is the pnp current gain, and fT is the cut-off frequency.

This trigger condition provides a set of design contours of trigger values where the number of elements and the cutoff frequency are the trigger parameters. Hence, an implementation is constructed whose trigger condition is above the non-native supply voltage as shown in FIG. 6B. This design is synthesized with parametrized cells (p-cells) from the SiGe library with CADENCETM based p-cells which have been fully dc and RF characterized devices. For analysis of the operation of this new mixed voltage BiCMOS SiGe power clamp, a matrix of studies varied the SiGe varactor number, the size of the output clamp and the role of emitter ballasting resistors. Experimental measurements included TLP, HBM and MM measurements.

To understand the operation of the circuit, HBM, MM and TLP measurements were first taken with the case of no additional varactors 108. The varactor number was modified to study the variation of the ESD results with varactor number. In the Table 1, the HBM and MM ESD results are shown as a function of the clamp size (emitter width). As the size of the structure increases, both HBM and MM ESD results increase.

TABLE 1

HMB and MM ESD results with a 120 Ghz SiGeC transistor and 90 Ghz clamp device.

| Trigger | Clamp | Width (um) | HBM (V) | MM (V) |
| --- | --- | --- | --- | --- |
| 120 Ghz | 90 GHz | | | |
| | | 50 | 2500 | 240 |
| | | 100 | 3100 | 390 |
| | | 150 | 4700 | 480 |
| | | 200 | 5000 | 600 |
| | | 250 | 5900 | 630 |

Comparing the 120 GHz SiGeC trigger circuit to the 47 GHz trigger network (0.18 versus 0.5 mm feature size), we find that there is no scaling impact with successive technology generation of this clamp design. This is significantly different from CMOS based clamps.

Table 2 contains the HBM and MM ESD results as a function of cathode finger number for SiGeC varactor structures. Table 3 shows the trigger condition as a function of the number of varactors in series.

TABLE 2

ESD results verses SiGe Varactor size.

| Varactor | Cathode Fingers | HBM (V) | MM (V) |
| --- | --- | --- | --- |
| 20x2 | | | |
| | 2 | 2400 | 210 |
| | 4 | 4900 | 330 |
| | 6 | 6500 | 420 |
| | 8 | 8200 | 550 |
| | 10 | >10,000 | 690 |

TABLE 3

Trigger condition vs SiGeC series varactors.

| 120 Ghz $BV_{CEO}$ | Number of Varactors | Trigger Voltage (V) |
| --- | --- | --- |
| 1.7 | | 1.7 |
| | 1 | 2.47 |
| | 2 | 3.15 |
| | 3 | 3.84 |

Evaluation of the HBM and MM results for the variable trigger network provided insight to the operation of the circuit and allows the user to check and verify that the circuit thus designed meets the input criteria for the desired application. A key result evident in the HBM, MM and TLP results is that as the trigger voltage condition is increased, the circuit operations still occurs but with degrading results with the increased voltage turn-on of the trigger network.

Table 4 demonstrates the relationship between the trigger voltage condition and the HBM and MM ESD result. Hence the delaying of the trigger firing leads to a lower ESD power clamp result.

TABLE 4

Trigger condition for HBM and MM results.

| Trigger (V) | Varactors (#) | Clamp Size (um) | HBM (V) | MM (V) |
| --- | --- | --- | --- | --- |
| 1.7 | 0 | 250 | 5900 | 630 |
| 2.47 | 1 | 250 | 4700 | 540 |
| 3.15 | 2 | 250 | 4400 | 540 |
| 3.84 | 3 | 250 | 3900 | 510 |

Extensive transmission line pulse testing also confirms the operation of the circuit. TLP testing was completed using a cable-based TLP system with a 100 nsec pulse width with less than a 10 nsec rise and fall time. The TLP I-V measurements were taken after 70 nsec in the measurement window to avoid spurious oscillations near the initial rise time in influencing the measurement quality. Leakage measurements were taken automatically to and testing was ceased at significant increases in the leakage current. Table 5 shows the TLP measurement of the failure current as a function of structure size and the number of SiGeC varactors in series. From the table below, it can be seen that the failure current decreases with the increase in the trigger condition. This unanticipated discovery will lead to a tradeoff between clamp size and trigger voltage.

TABLE 5

Failure current as a function of clamp size and trigger condition.

| Clamp Size Segments | Failure Current (0 Var) | Failure Current (1 Var) | Failure Current (2 Var) |
| --- | --- | --- | --- |
| 1 | 0.7 A | 0.72 | 0.58 |
| 2 | 1.25 | 1.05 | 1.0 |
| 3 | 1.7 | 1.5 | 1.3 |
| 4 | 1.8 | 1.6 | 1.3 |
| 5 | 2.1 | 1.6 | |

While the invention has been described in terms of a single preferred embodiment, those skilled in the art will recognize that the invention can be practiced with notification within the spirit and scope of the appended claims.

What is claimed is:

1. A computerized electrostatic discharge (ESD) protection circuit design system, comprising:
    a user interface for inputting a plurality of design parameters;
    an ESD kit comprising parameterized cells (p-cells) of low level electronic components and p-cells of higher level electronic circuit components, said p-cells of higher level electronic circuit components comprising growable and non growable segments; and
    a processor for generating an ESD protection circuit by combining said lower level p-cells into higher level p-cells and calculating a growth for said growable segments based on said design parameters.

2. A computerized ESD protection circuit design system as recited in claim 1 wherein said ESD protection circuit is output in a graphical circuit layout format.

3. A computerized ESD protection circuit design system as recited in claim 1 wherein said ESD protection circuit is output in a graphical circuit schematic format.

4. A computerized ESD protection circuit design system as recited in claim 1 wherein said p-cells of higher level electronic circuit components inherit parameters from p-cells of said low level electronic components.

5. A computerized ESD protection circuit design system as recited in claim 1 wherein said (p-cells) of low level electronic components comprise at least one of diode p-cells, varactor p-cells, stretch line p-cells, transistor p-cells, resistor p-cells, and capacitor p-cells.

6. A computerized ESD protection circuit design system as recited in claim 1 wherein said growable segments comprise diode string p-cells having a variable number of diodes.

7. A computerized ESD protection circuit design system as recited in claim 1 wherein said growable segments comprise clamp circuit p-cells having a variable number of parallel connected clamp circuits.

8. A method of forming an electrostatic discharge (ESD) protection circuit, comprising the steps of:
    forming a kit of parameterized cells (p-cells) modeling elements of an ESD protection device;
    providing an input variable set;
    providing a computer interface for allowing a user to input parameters for said input variable set;
    forming a higher order ESD protection circuit from said p-cells based on said parameters; and
    outputting said higher order ESD protection circuit in one of a circuit layout and a circuit schematic graphical format.

9. A method of forming an ESD protection circuit as recited in claim 8, wherein said p-cells comprise growable and non-growable p-cells.

10. A method of forming an ESD protection circuit as recited in claim 8, wherein said growable p-cells comprise diode string p-cells having a variable number of diodes.

11. A method of forming an ESD protection circuit as recited in claim 8, wherein said growable p-cells comprise clamp circuit p-cells having a variable number of parallel connected clamp circuits.

12. A method of forming an ESD protection circuit as recited in claim 8, wherein said higher order ESD protection circuits comprise rail-to-rail circuits.

13. A method of forming an ESD protection circuit as recited in claim 8, wherein said higher order ESD protection circuits comprise power clamp circuits.

14. A computerized electrostatic discharge (ESD) protection circuit design kit comprising a plurality of circuit elements modeled as a parameterized cell (P-cell), comprising:
    a MOSFET p-cell;
    an npn transistor p-cell;
    a pnp transistor p-cell;
    a resistor p-cell;
    a capacitor p-cell; and
    a plurality of hierarchical ESD circuit p-cells made up of ones of said MOSFET p-cell, npn transistor p-cell, pnp transistor p-cell, resistor p-cell, and capacitor p-cell.

15. A computerized electrostatic discharge (ESD) protection circuit design kit as recited in claim 14, wherein said hierarchical ESD circuit p-cells comprise growable and non-growable p-cells.

16. A computerized electrostatic discharge (ESD) protection circuit design kit as recited in claim 15, wherein said growable p-cells comprise diode string p-cells having a variable number of diodes.

17. A computerized electrostatic discharge (ESD) protection circuit design kit as recited in claim 15, wherein said growable p-cells comprise clamp circuit p-cells having a variable number of parallel connected clamp circuits.

18. A computerized electrostatic discharge (ESD) protection circuit design kit as recited in claim 14, wherein said hierarchical ESD circuit p-cells comprise rail-to-rail circuits.

19. A computerized electrostatic discharge (ESD) protection circuit design kit as recited in claim 14, wherein said hierarchical ESD circuit p-cells comprise power clamp circuits.

* * * * *